(12) United States Patent
Gonzalez

(10) Patent No.: US 7,355,244 B2
(45) Date of Patent: Apr. 8, 2008

(54) ELECTRICAL DEVICES WITH MULTI-WALLED RECESSES

(75) Inventor: Fernando Gonzalez, Boise, ID (US)

(73) Assignee: Micron Technology, Inc., Boise, ID (US)

(*) Notice: Subject to any disclaimer, the term of this patent is extended or adjusted under 35 U.S.C. 154(b) by 6 days.

(21) Appl. No.: 11/277,222

(22) Filed: Mar. 22, 2006

(65) Prior Publication Data

US 2006/0151830 A1 Jul. 13, 2006

Related U.S. Application Data

(62) Division of application No. 10/929,800, filed on Aug. 30, 2004, now Pat. No. 7,041,556, which is a division of application No. 09/945,495, filed on Aug. 30, 2001, now Pat. No. 6,800,899.

(51) Int. Cl.
*H01L 29/94* (2006.01)
(52) U.S. Cl. .............. 257/330; 257/332; 257/622
(58) Field of Classification Search .......... 257/330, 257/332, 622, E29.2, E29.201
See application file for complete search history.

(56) References Cited

U.S. PATENT DOCUMENTS

| | | | |
|---|---|---|---|
| 3,833,919 A | 9/1974 | Naber | |
| 5,146,426 A * | 9/1992 | Mukherjee et al. | 257/316 |
| 5,244,824 A | 9/1993 | Sivan | |
| 5,408,116 A * | 4/1995 | Tanaka et al. | 257/327 |
| 5,998,835 A | 12/1999 | Furukawa et al. | |
| 6,117,734 A * | 9/2000 | Nakamura | 438/268 |
| 6,168,996 B1 * | 1/2001 | Numazawa et al. | 438/270 |
| 6,239,465 B1 | 5/2001 | Nakagawa | |
| 6,291,310 B1 | 9/2001 | Madson et al. | |
| 6,372,564 B1 * | 4/2002 | Lee | 438/192 |
| 6,432,775 B2 | 8/2002 | Blanchard | |
| 6,476,444 B1 | 11/2002 | Min | |
| 6,482,701 B1 * | 11/2002 | Ishikawa et al. | 438/270 |
| 6,577,010 B2 | 6/2003 | Batra et al. | |
| 6,653,676 B2 | 11/2003 | Tsu et al. | |
| 6,825,087 B1 | 11/2004 | Sharp et al. | |
| 2002/0106866 A1 | 8/2002 | Chen | |
| 2002/0130351 A1 | 9/2002 | Ghodsi | |

(Continued)

FOREIGN PATENT DOCUMENTS

| | | |
|---|---|---|
| JP | 56-058267 | 5/1981 |
| JP | 63-076480 | 4/1988 |
| JP | 02-110973 | 4/1990 |
| JP | 05-021789 | 1/1993 |

OTHER PUBLICATIONS

"Self Aligning Metal to Polysilicon Contacts", *IBM Technical Disclosure Bulletin*, 14, (Mar. 1972).

(Continued)

*Primary Examiner*—Matthew E. Warren
(74) *Attorney, Agent, or Firm*—Schwegman, Lundberg & Woessner, P.A.

(57) ABSTRACT

The invention relates to a vertical transistor and an oxidation process that achieves a substantially curvilinear recess bottom. The recess serves as the gate receptacle that may facilitate a more uniform gate oxide layer. One embodiment relates to a storage cell that is disposed in the recess along with an electrode. Another embodiment relates to a system that includes the vertical transistor or the vertical storage cell.

26 Claims, 15 Drawing Sheets

U.S. PATENT DOCUMENTS

2002/0154483 A1 10/2002 Homer et al.
2002/0168852 A1 11/2002 Harshfield et al.
2005/0026372 A1 2/2005 Gonzalez

OTHER PUBLICATIONS

Chang, C., et al., "Enabling Shallow Trench Isolation for 0.1 micrometer Technologies and Beyond", *Symposium on VLSI Technology Digest of Technical Papers*, (1999),2 pages.

Goebel, Bernd, et al., "Vertical N-Channel MOSFETs for Extremely High Density Memories: The Impact of Interface Orientation on Device Performance", *IEEE Transactions on Electron Devices*, vol. 48, No. 5,(May 2001),897-906.

Matsuda, T., et al., "Novel Corner Rounding Process for Shallow Trench Isolation utilizing MSTS (Micro-Structure Transformation of Silicon)", *IEDM*, (1998),pp. 137-140.

Uh, H., et al., "A Strategy for Long Data Retention Time of 512Mb DRAM with 0.12micrometer Design Rule", *Symposium on VLSI Technology Digest of Technical Papers*, (2001),2 pages.

\* cited by examiner

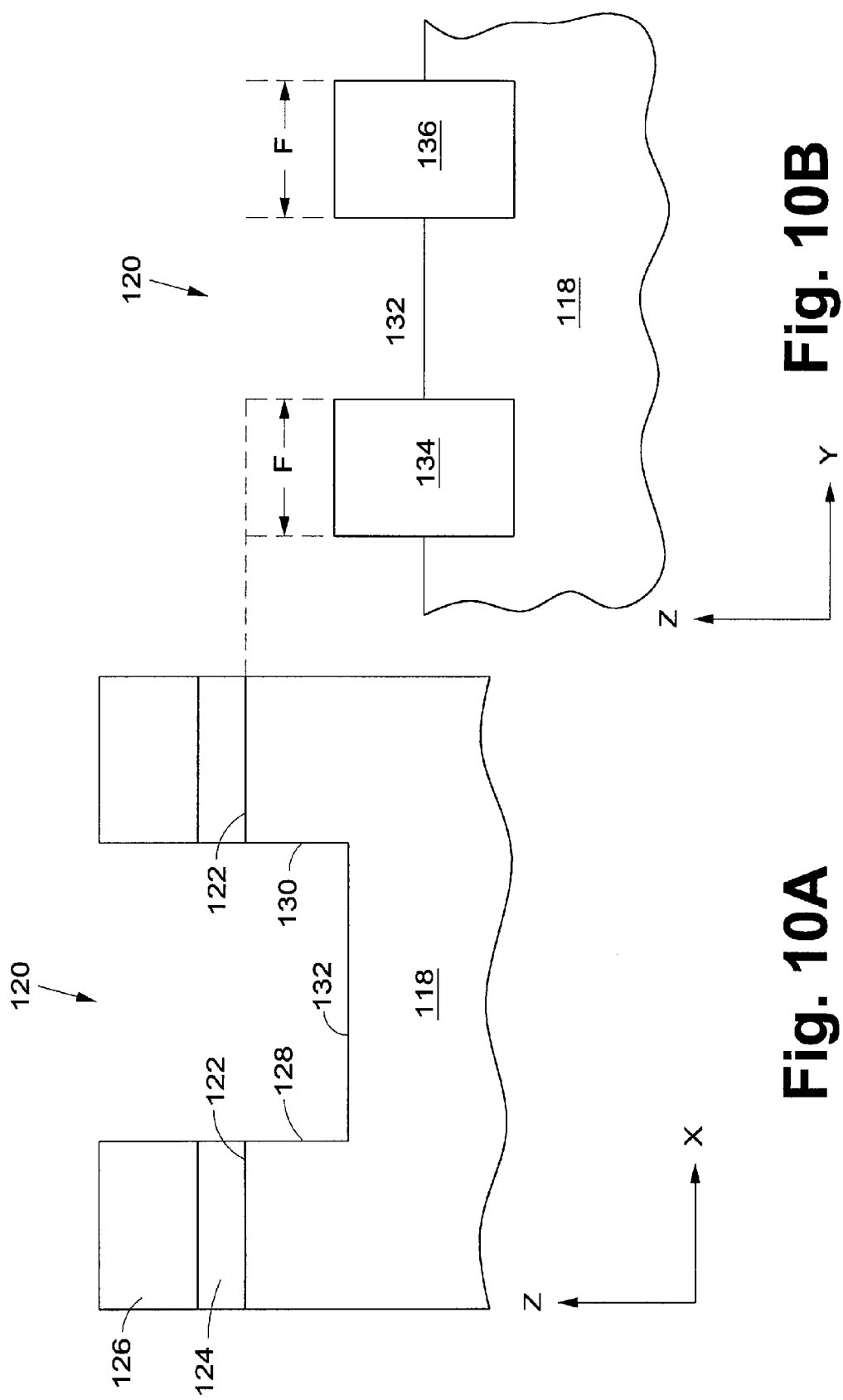

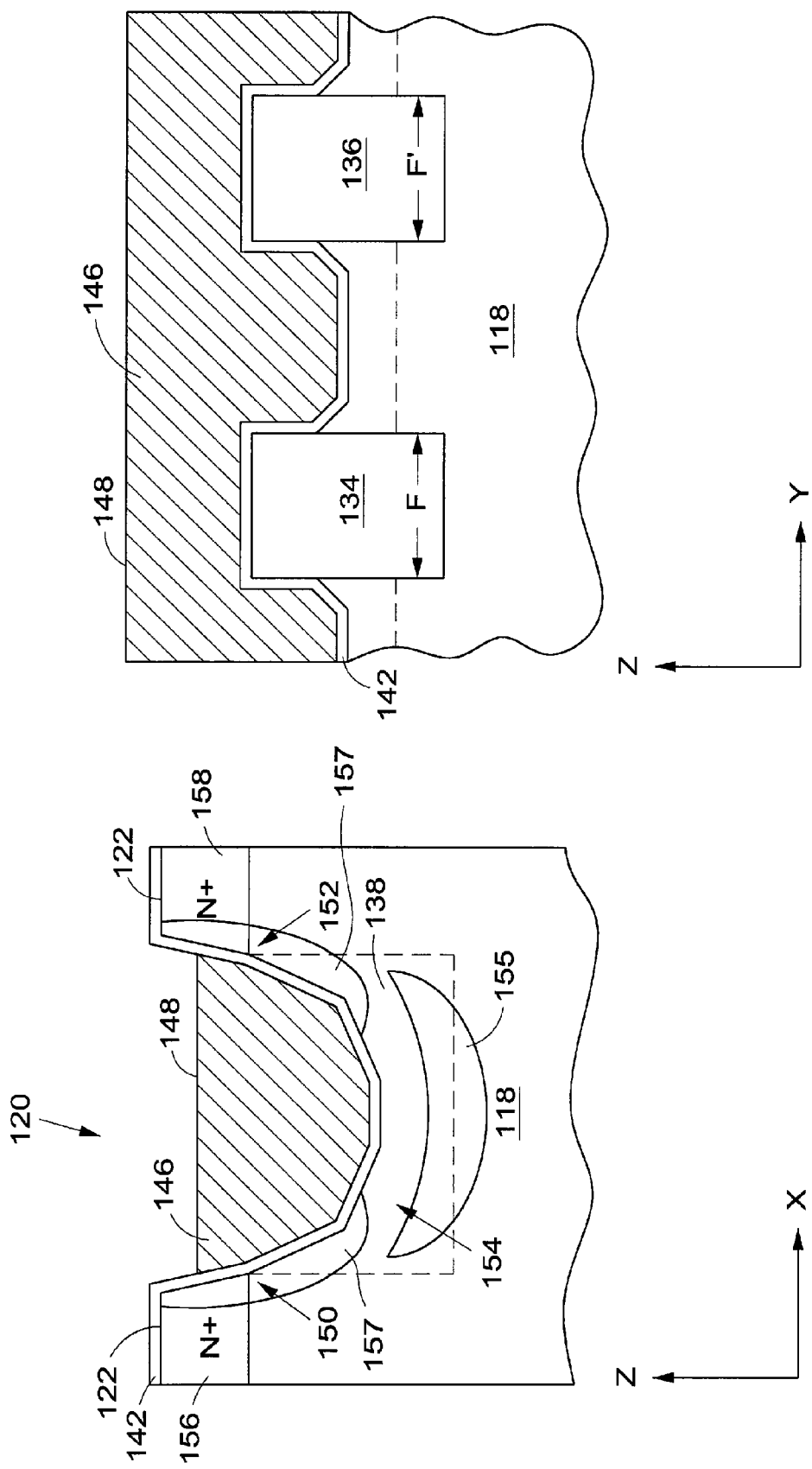

ELECTRICAL DEVICES WITH MULTI-WALLED RECESSES

This application is a Divisional of U.S. application Ser. No. 10/929,800, filed Aug. 30, 2004, now U.S. Pat. No. 7,041,556, which is a Divisional of U.S. application Ser. No. 09/945,495, filed Aug. 30, 2001, now U.S. Pat. No. 6,800,899, which are incorporated herein by reference.

FIELD OF THE INVENTION

The present invention relates to vertical transistor fabrication. In particular, the present invention relates to fabrication of a trench with a curvilinear trench bottom for a vertical transistor. The present invention also relates to an application of the vertical transistor with a floating gate that follows the contour of the curvilinear trench bottom.

BACKGROUND OF THE INVENTION

Integrated circuit technology relies on transistors to formulate functional circuits. The complexity of these circuits requires the use of an ever-increasing number of transistors. As the number of transistors increases, the surface space on the semiconductor substrate becomes more valuable.

Miniaturization is the process of crowding more active devices upon a given amount of semiconductor surface space, while improving both fabrication cost and device performance. As the surface space on a semiconductor substrate becomes more crowded with active devices, one solution to the crowding is to build a device that is in a vertical orientation to the semiconductor substrate.

Semiconductor processing of metal oxide semiconductor field-effect transistors (MOSFETs) requires the formation of a gate that will make an active device. The gate may typically be a conductor that is insulated from the semiconductor substrate by a dielectric layer such as a gate oxide layer over the semiconductor substrate. One particular MOSFET of interest is the vertical MOSFET because the gate is disposed vertically downward into the semiconductor substrate. As miniaturization progresses, the size and shape of the vertical transistor and the quality of the gate oxide layer become more important to both processing yield and to field use life.

Typically, a vertical transistor is formed in a rectilinear recess that includes two substantially vertical sidewalls and a substantially horizontal bottom. The recess is next covered with a dielectric layer. As such, the corner between sidewall and bottom may be substantially a right angle or there about, as the sidewalls are sometimes tapered outward from bottom to top of the recess. Because of the corner, there exists a greater likelihood of the dielectric layer breaking down at the corner because of enhanced electrical field activity at the corner. Consequently, the corner causes a reliability issue for the transistor as a field failure will result once the dielectric layer has broken down.

BRIEF DESCRIPTION OF THE DRAWINGS

In the drawings like reference numerals describe substantially similar components throughout the several views. Like numerals having different letter suffixes represent different orientational views of substantially similar components.

FIGS. 10A and 10B are elevational cross-sections of a semiconductor structure that include a shallow-trench isolation (STI).

FIGS. 13A and 13B are elevational cross-sections of the semiconductor structure depicted in FIGS. 12A and 12B, respectively, after further processing to achieve a vertical transistor.

DETAILED DESCRIPTION OF THE INVENTION

The above-mentioned problems with integrated circuits and other problems are addressed by the present invention and will be understood by reading and studying the written description. Structure and process embodiments are set forth herein.

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientations.

Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

Figure 1:
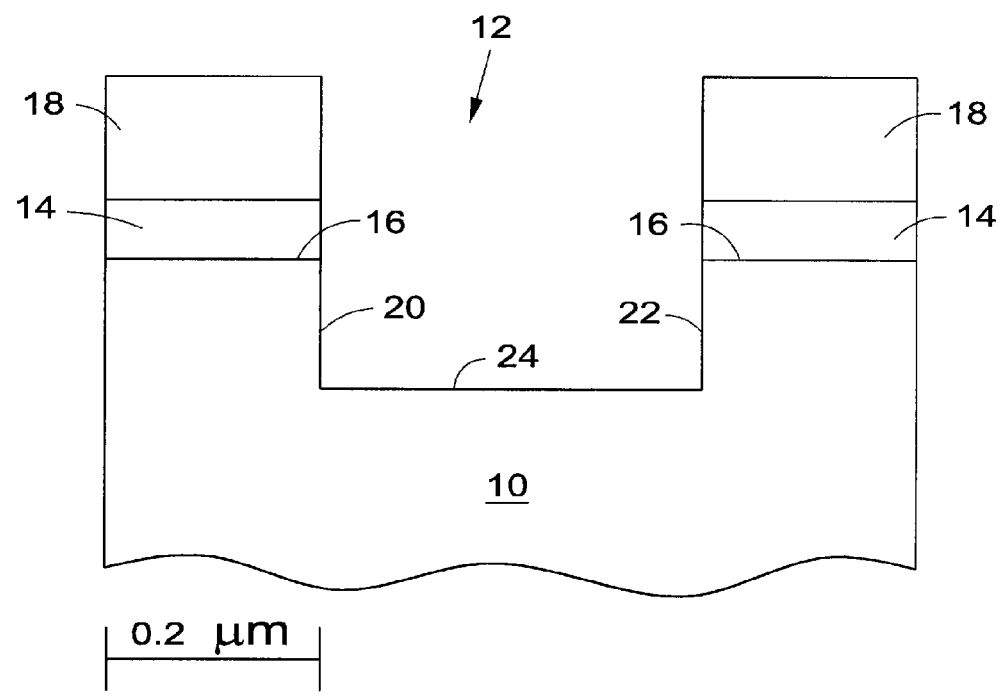
FIG. 1 is an elevational cross-section of a semiconductor structure that reveals a recess according to the teachings of the present invention.

FIG. 1 is an elevational cross-section of a substrate 10 that has been patterned with a recess 12. Substrate 10 may be a semiconductive material such as monocrystalline silicon or other semiconductive materials. In one embodiment, substrate 10 comprises <100> monocrystalline silicon that may be used for a MOSFET. A dielectric layer 14 is depicted upon an upper surface 16 of substrate 10. In one embodiment, dielectric layer 14 is an oxide of the semiconductive material such as a thermal oxide or a deposited oxide. In another embodiment, dielectric layer is a nitride-oxide composite layer that may be used to cover other regions of substrate 10 during fabrication. In another embodiment, dielectric layer 14 is a nitride-polysilicon-oxide composite layer that may be used to cover other regions of substrate 10 during fabrication. The nitride-polysilicon-oxide composite is sometimes referred to as a poly-buffer locos (PBL) technique. Patterning has been accomplished by a mask 18 that may be a photoresist as is known in the art. Recess 12 may typically have three monolithic crystallographic surfaces such as a first sidewall 20, a second sidewall 22, and a bottom 24. By way of non-limiting example, it is noted that substrate 10 has a 0.2 micrometer (micron) metric for reference purposes.

Figure 2:
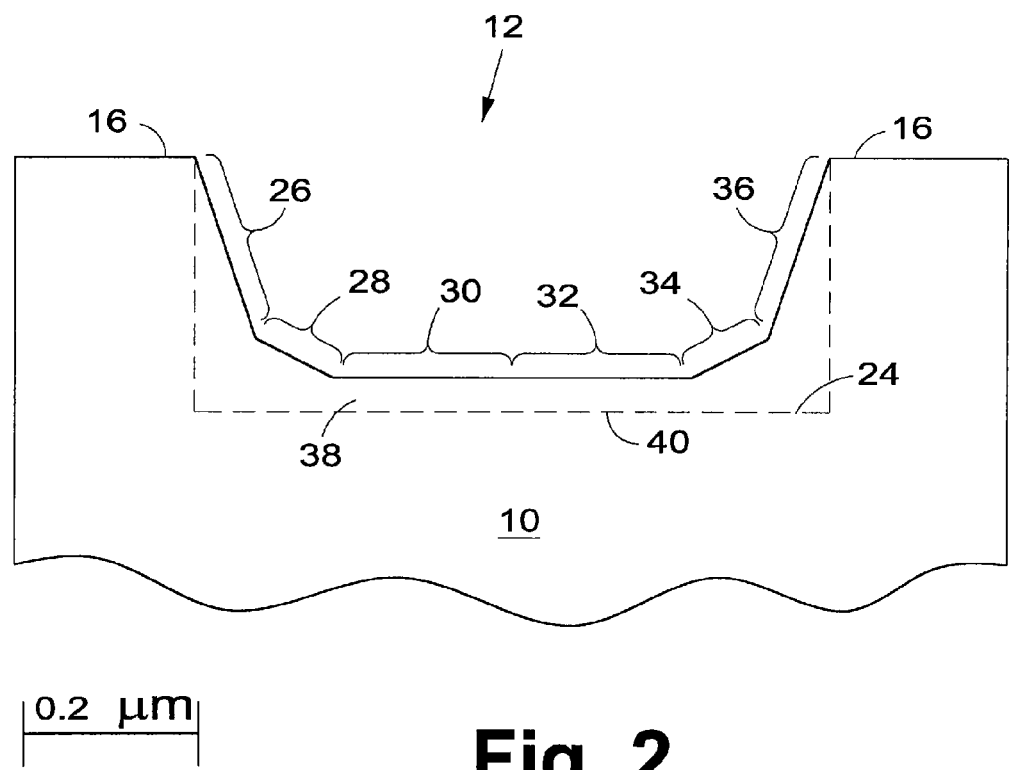
FIG. 2 is a line drawing of a photomicrograph of the structure depicted in FIG. 1 after further processing.

According to an embodiment, recess 12 is first processed under conditions to form an epitaxial semiconductor film comprising more than the three monolithic surfaces. One embodiment of this process is depicted in FIG. 2. FIG. 2 is a line drawing of a photomicrograph after processing according to an embodiment. Processing was carried out at about 900° C. and about 20 seconds at ambient pressure and in a hydrogen-type environment. The hydrogen-type environment was in an $H_2$/Ar ratio where the hydrogen was from about 4% to about 100%, although a lower $H_2$/Ar ratio than 4% may be used. The lower range is sometimes required due to equipment safety limitations.

In FIG. 2, more than three monolithic crystallographic surfaces 26, 28, 30, 32, 34, and 36 are seen. By "monolithic crystallographic surfaces", it may be understood that at this magnification, various substantially planar or substantially curvilinear regions may be designated. For example, monolithic crystallographic surface 26 may be considered to be substantially planar, but monolithic crystallographic surface 28 may be considered to be substantially curvilinear.

Although the exact mechanism is not precisely set forth herein, reshaping of the three monolithic crystallographic surfaces 20, 22, and 24, depicted in FIG. 1, may be caused by the redeposition of semiconductive material from within the recess 12 to other regions in the recess 12. In the $H_2$ environment, various hydrogen-silicon species can form such as SiH, $SiH_2$, $SiH_3$, and $SiH_4$, among others. The mobilization of silicon within recess, and its redeposition, results in a localized epitaxial semiconductor film 38. The localized nature of epitaxial semiconductor film 38 means that it forms primarily within recess 12. Epitaxial semiconductor film 38 that is depicted in FIG. 2 has an arbitrary boundary 40 that relates to the former dimensions of recess 12 depicted in FIG. 1. It is understood that where substrate 10 is monocrystalline silicon, substrate 10 may have a dislocation density that is lower than the dislocation density of epitaxial semiconductor film 38.

Figure 3:
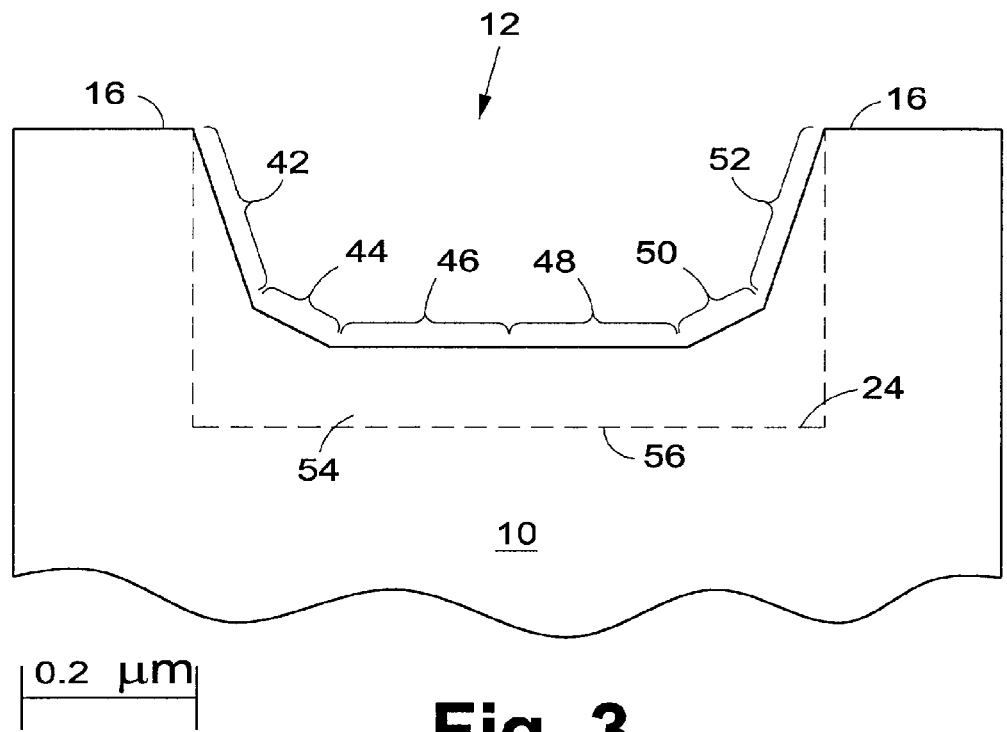
FIG. 3 is a line drawing of a photomicrograph of the structure depicted in FIG. 1 after further processing according to an alternative process according to the teachings of the present invention.

FIG. 3 is a line drawing of a photomicrograph after processing according to an embodiment. In another example depicted in FIG. 3, recess 12 has been processed at about 1,000° C. and for about 60 seconds in a hydrogen-type atmosphere as set forth herein. More than three monolithic crystallographic surfaces 42, 44, 46, 48, 50, and 52 have been designated and an epitaxial semiconductor film 54 has been formed with an arbitrary boundary 56 that relates to recess 12 depicted in FIG. 1.

Figure 4:
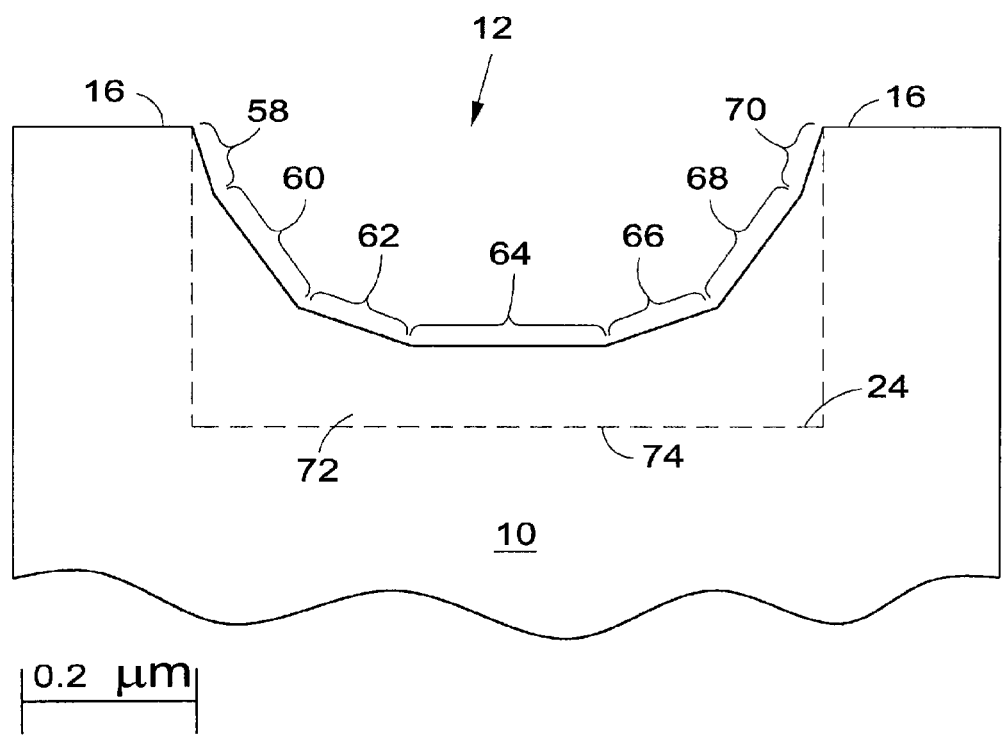
FIG. 4 is a line drawing of a photomicrograph of the structure depicted in FIG. 1 after further processing according to an alternative process.

FIG. 4 is a line drawing of a photomicrograph after processing according to an embodiment. In another example depicted in FIG. 4, recess 12 has been processed at about 1,100° C. and for about 60 seconds in a hydrogen-type atmosphere as set forth herein. More than three monolithic crystallographic surfaces 58, 60, 62, 64, 66, 68, and 70 have been designated and an epitaxial semiconductor film 72 has been formed with an arbitrary boundary 74 that relates to recess 12 depicted in FIG. 1.

By way of description, it may be said of all semiconductor substrates depicted in FIGS. 2-4, that the epitaxial semiconductor film 38, 54, or 74, respectively, has a minor thickness at a region closer to upper surface 16 than to the former bottom 24, and a major thickness that is closer to the former bottom 24 than to upper surface 16. Another way of designating the more than three monolithic crystallographic surfaces depicted in FIGS. 2-4 is that after processing according to an embodiment, there exists a segmented-surface profile of the epitaxial semiconductor film 38, etc. At these magnifications, the more than three monolithic crystallographic surfaces designated in FIGS. 2-4 are also described as a substantially curvilinear bottom profile of epitaxial semiconductive material.

Figure 5:
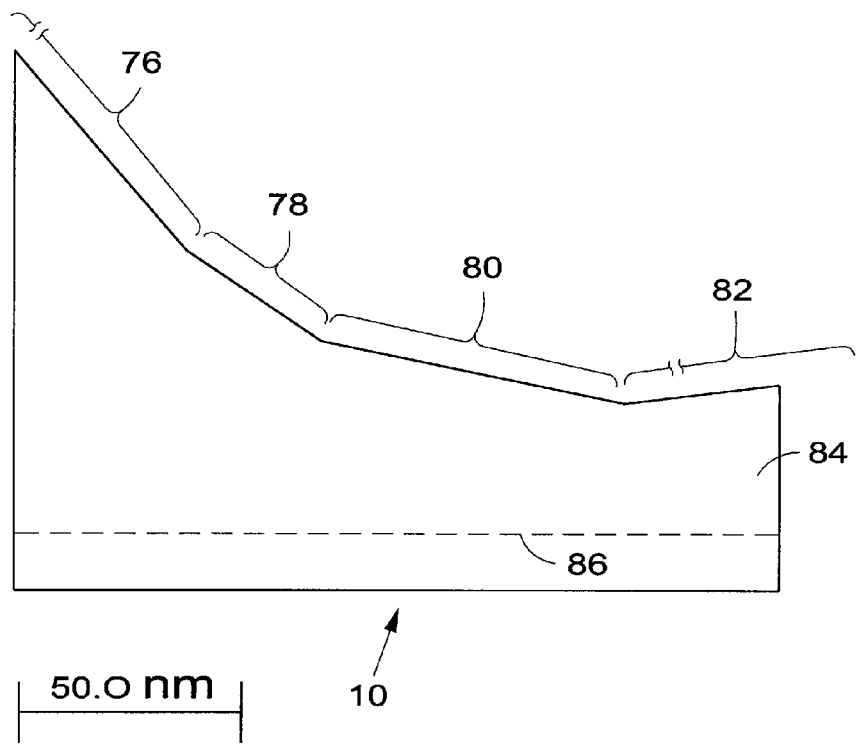
FIG. 5 is a line drawing of a photomicrograph of a semiconductor structure that reveals monolithic crystallographic surfaces.

Closer inspection of epitaxial monocrystalline silicon that is processed according to an embodiment set forth herein is further illustrative. FIG. 5 is line drawing of a photomicrograph wherein a substantially curvilinear bottom profile of epitaxial semiconductive material is depicted. It is noted that substrate 10 has a 50 nanometer (nm) metric for reference purposes. The substantially curvilinear bottom profile of epitaxial semiconductive material has a segmented-surface profile that has been designated as parts of four monolithic crystallographic surfaces 76, 78, 80, and 82. Further, substrate 10 has an epitaxial semiconductor film 84 and an arbitrary boundary 86 that designates a former recess bottom. Arbitrary boundary 86 is not necessarily drawn to scale.

Figure 6:
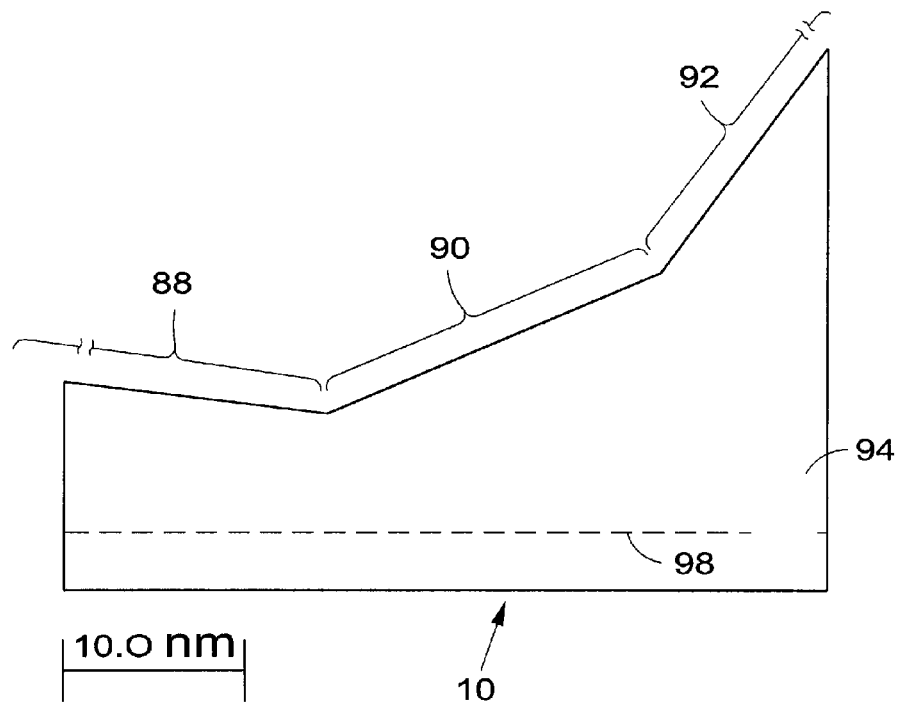
FIG. 6 is a line drawing of a photomicrograph of a semiconductor structure that reveals monolithic crystallographic surfaces.
Figure 7:
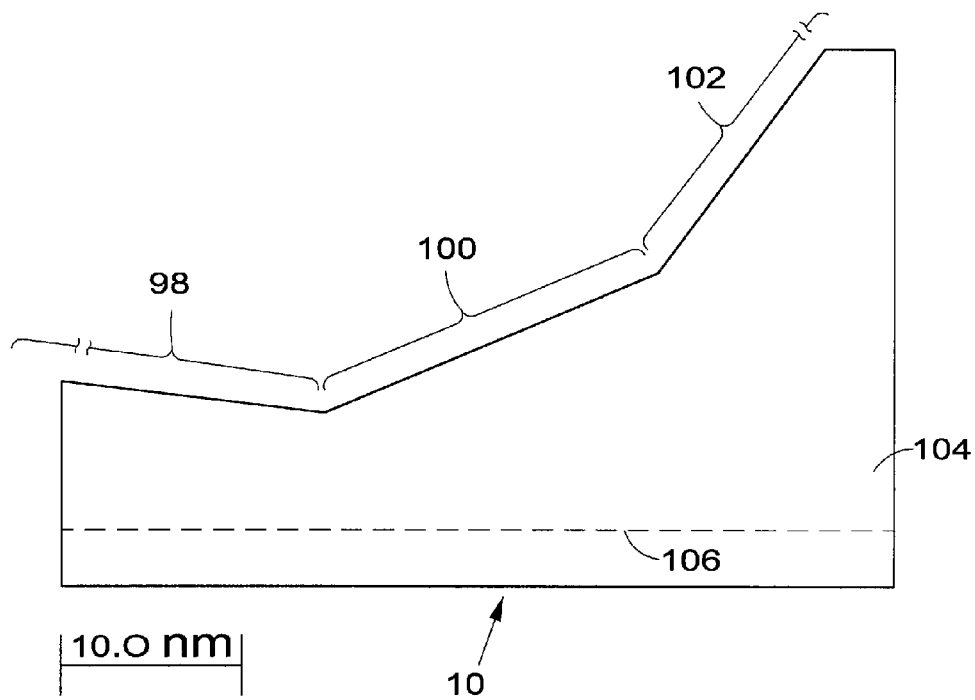
FIG. 7 is a line drawing of a photomicrograph of a semiconductor structure that reveals monolithic crystallographic surfaces.
Figure 8:
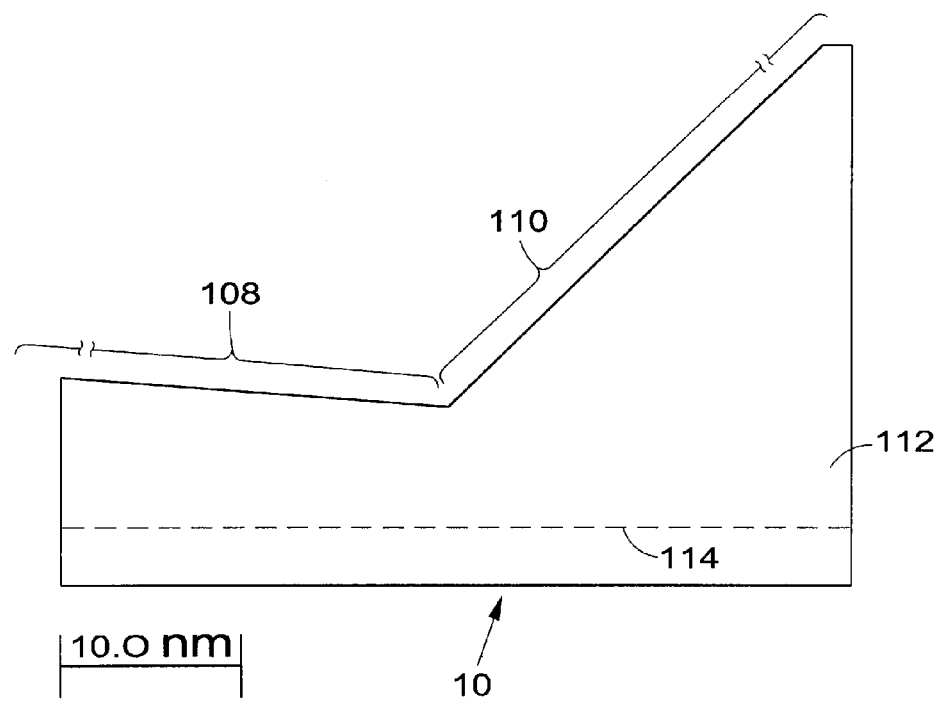
FIG. 8 is a line drawing of a photomicrograph of a semiconductor structure that reveals monolithic crystallographic surfaces.

Other examples are given at further magnification in FIGS. 6-8. FIGS. 6-8 are line drawings of photomicrographs wherein substantially curvilinear bottom profiles of epitaxial semiconductive material is depicted. By way of non-limiting example, it is noted that substrate 10 has a 10 nm metric for reference purposes.

With reference to FIG. 6, the substantially curvilinear bottom profile of epitaxial semiconductive material has a segmented-surface profile that has been designated as parts of three monolithic crystallographic surfaces 88, 90, and 92. Further, substrate 10 has an epitaxial semiconductor film 94 and an arbitrary boundary 96 that designates a former recess bottom. Arbitrary boundary 96 is not necessarily drawn to scale. The recess was processed at about 900° C. and for about 20 seconds in a hydrogen-type atmosphere as set forth herein.

With reference to FIG. 7, the substantially curvilinear bottom profile of epitaxial semiconductive material has a segmented-surface profile that has been designated as parts of three monolithic crystallographic surfaces 98, 100, and 102. Further, substrate 10 has an epitaxial semiconductor film 104 and an arbitrary boundary 106 that designates a former recess bottom. Arbitrary boundary 106 is not necessarily drawn to scale. The recess was processed at about 900° C. and for about 60 seconds in a hydrogen-type atmosphere as set forth herein.

With reference to FIG. 8, the substantially curvilinear bottom profile of epitaxial semiconductive material has a segmented-surface profile that has been designated as parts of two monolithic crystallographic surfaces 108-110. Further, substrate 10 has an epitaxial semiconductor film 112 and an arbitrary boundary 114 that designates a former recess bottom. Arbitrary boundary 114 is not necessarily drawn to scale. The recess was processed at about 1,000° C. and for about 60 seconds in a hydrogen-type atmosphere as set forth herein.

As illustrated in FIGS. 2-8, various way may be chosen to designate a "curvilinear" bottom of a recess that has an epitaxial semiconductor film. Other expressions may also be used to designate the profile, shape, crystallography, and varying thickness, etc. of the structure.

Figure 9:
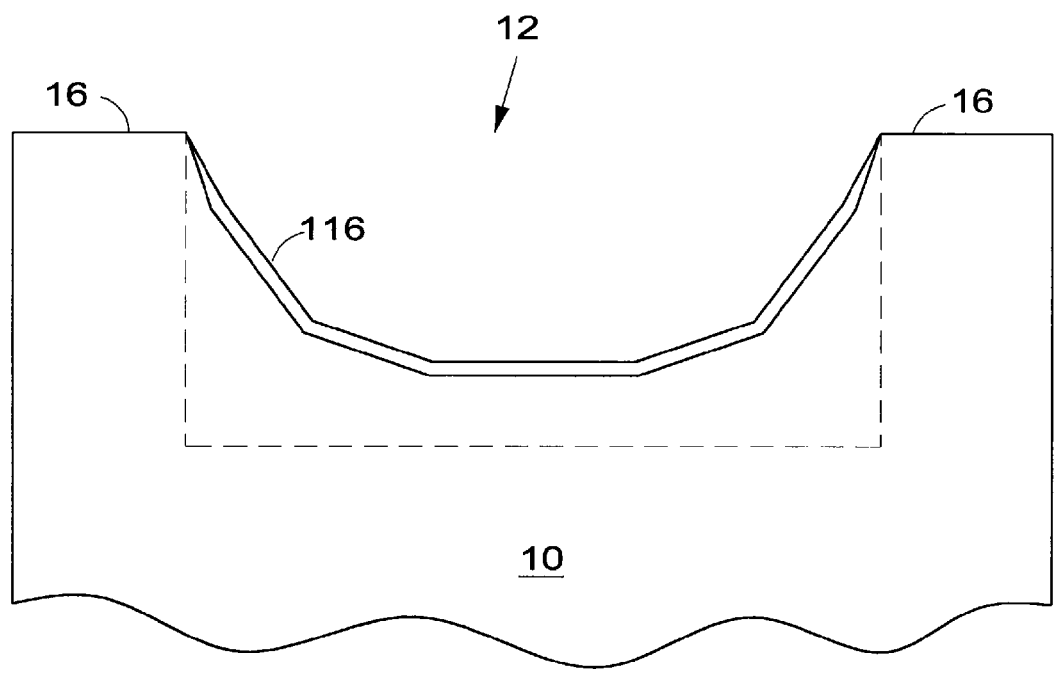
FIG. 9 is an elevational cross-section of a semiconductor structure with an epitaxial semiconductor film that has been annealed with a hydrogen-type process.

FIG. 9 illustrates substrate 10 depicted in FIG. 4 after further processing. In one embodiment, the redeposition of epitaxial semiconductor material in recess 12 may result in dangling edges of the epitaxial matrix at the profile edge. Second processing of the material that defines the recess 12 may be carried out in which a rapid thermal anneal (RTA) is accomplished. For example, another hydrogen-type process may be done such as using deuterium in a second processing that will act to smooth the dangling edges of the epitaxial semiconductor film. Deuterium, if it stays in the silicon, may have a beneficial effect such as mitigating what is known as hot carrier effects. Processing may be carried out in a range from about 4% deuterium in an inert carrier to about 100% deuterium. Alternatively, the hydrogen-type processing may include deuterium and hydrogen in various ratios as set forth herein and they may be used with or without an inert carrier. Other processing conditions include $H_2$ in a range from about 4% $H_2$ in an inert carrier to about 100% $H_2$, a pressure from about 1 milliTorr to about 1 atmosphere, a temperature from about 800° C. to about 1,200° C., and a processing time from about 20 seconds to about two minutes. In FIG. 9, a silicon-hydrogen transition layer 116, or silicon-deuterium transition layer 116, or silicon-hydrogen-deuterium transition layer 116 is depicted. The presence of transition layer 116 may be detected by ordinary qualitative and quantitative analysis methods such as scanning electron microscopy (SEM), x-ray diffraction (XRD), or others. Further, all hydrogen and/or deuterium may be volatilized, but the dangling bonds are reduced in number by the process embodiment.

FIGS. 10A and 10B illustrate another embodiment. In this embodiment, a substrate 118 has a recess 120 that has been patterned through an upper surface 122 and an oxide layer 124 by a mask 126. Recess 120 is defined in the X-dimension as three monolithic crystallographic surfaces of semiconductive material such as a first sidewall 128, a second sidewall 130, and a bottom 132. Recess 120 is bounded in the Y-dimension with a first shallow trench isolation (STI) 134, a second STI 136, and bottom 132. First STI 134 may be considered to be positioned above the plane of the structure depicted in FIG. 10A, and second STI 136 maybe considered to be positioned below the plane of the structure depicted in FIG. 10A. It is noted that first STI 134 and second STI 136 may have originally been as tall as upper surface 122, but the etch process to achieve recess 120 has also lowered their heights to a degree that is less than the depth of recess 120. In one embodiment, recess 120 has a depth from upper surface 122 to bottom 132 in the range from about 500 Å to about 1,500 Å, and preferably about 1,000 Å. The original height of the STI structures before the etching of recess 120, may be in a range from about 1,000 Å to about 3,500 Å, and preferably about 2,500 Å.

By way of further reference, according to design rules, a minimum feature, F, may be part of the metric of the structure depicted in FIGS. 10A and 10B. In this embodiment, the minimum feature, F, may be the size of first STI 134 or second STI 136 as viewed in the Y-dimension. For example, photolithography process flows may have minimum features that are 0.25 micrometers (microns), 0.18 microns, and 0.13 microns. It is understood that the various metrics such as 0.25 microns may have distinctly different dimensions in one business entity from a comparative business entity. Accordingly, such metrics, although quantitatively called out, may differ between a given two business entities. Other minimum features that may be accomplished in the future are applicable to the present invention.

Figure 11B:
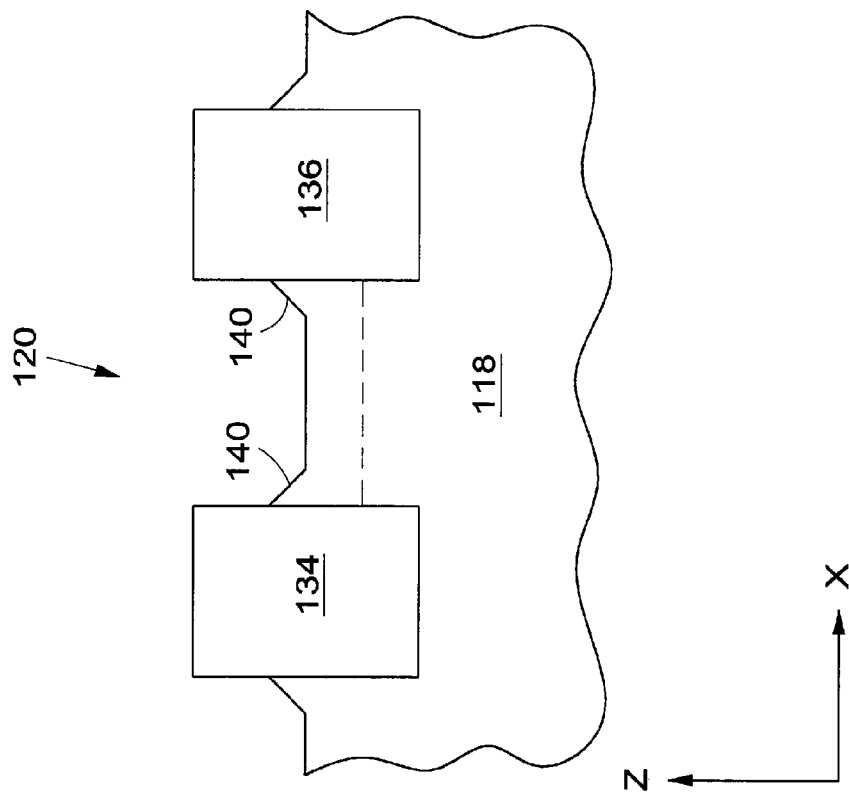
FIGS. 11A and 11B are elevational cross-sections of the semiconductor structure depicted in FIGS. 10A and 10B, respectively, after further processing to achieve an epitaxial semiconductor film.
Figure 11A:
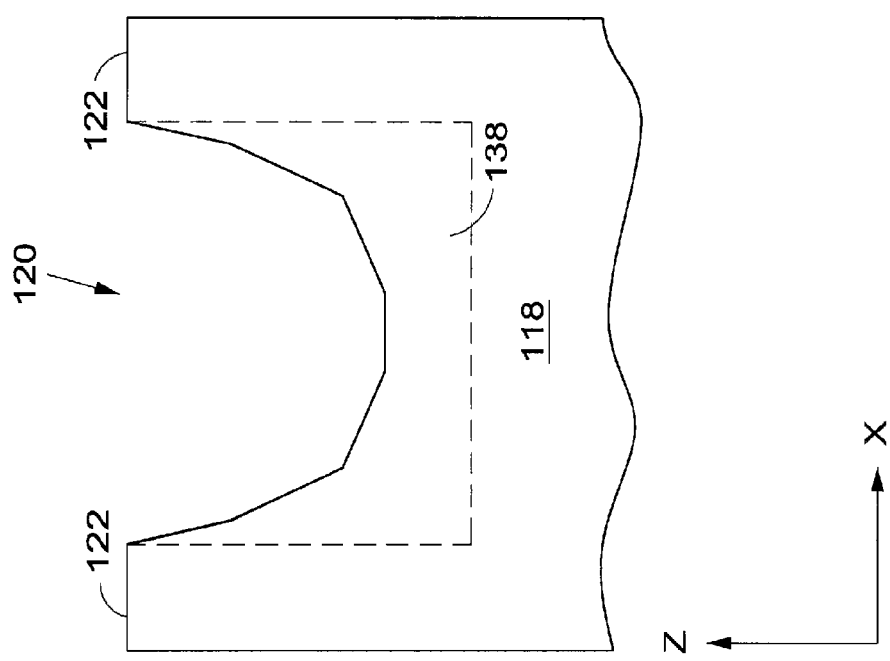

Further processing is carried out according to embodiments as set forth herein. FIGS. 11A and 11B illustrate further processing of substrate 118 depicted in FIGS. 10A and 10B, respectively. Recess 120 has been processed in a hydrogen-type atmosphere as set forth herein. An epitaxial semiconductor film 138 has been formed that has a bottom profile that may be described as having more than three monolithic crystallographic surfaces as set forth herein, or by any other designation as set forth herein. A film 140 may also be formed to a lesser degree against first STI 134 and second STI 136, however, film 140 may be polycrystalline silicon.

Figure 12B:
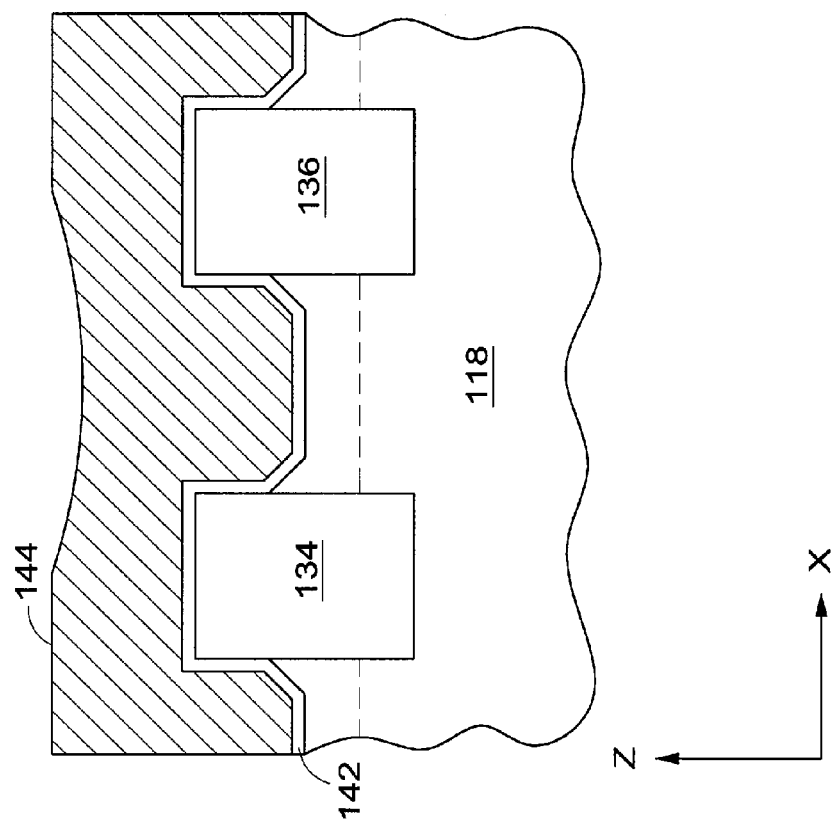
FIGS. 12A and 12B are elevational cross-sections of the semiconductor structure depicted in FIGS. 11A and 11B, respectively, after further processing.
Figure 12A:
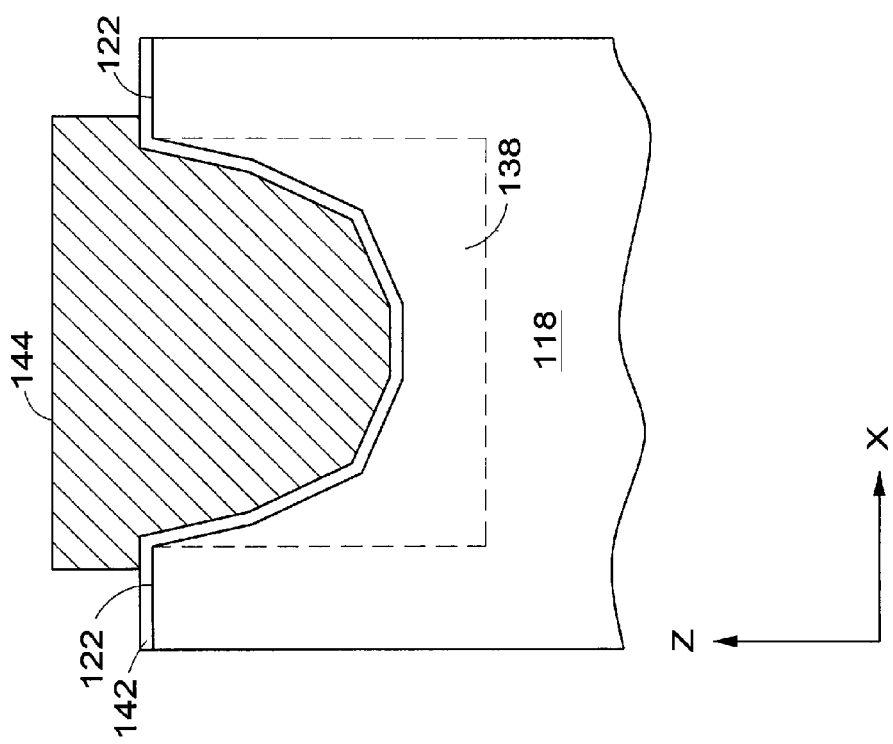

FIGS. 12A and 12B illustrate the structure depicted in FIGS. 11A and 11B after further processing. A dielectric layer 142 is formed that acts as a gate dielectric. Formation of dielectric layer 142 is depicted as a layer that has been formed by various processing options. One processing option includes thermal oxide. One processing option includes thermal oxide in a nitrogen environment that results in a thermal oxynitride composite. Another processing option includes a composite gate oxide such as zirconia and hafnia. Other process may be carried out to form gate dielectric layer 142 including deposition and oxidation processes. One oxidation processing option includes plasma-enhanced (PE) oxidation according to known technique. Another oxidation processing option includes remote plasma oxidation (RPO) according to known technique. Another oxidation processing option includes in-situ steam generator (ISSG) oxidation according to known technique.

Other processes may be carried out to form a gate dielectric layer 142 in the structure depicted in FIG. 12A including other deposition processes or oxidation processes. For example, a thermal oxide may be formed. Dielectric layer 142 may be made from various materials such as a refractory metal oxide, a thermal oxide, a silicon oxide, a silicon oxynitride, a silicon nitride, a carbon-doped oxide, and combinations thereof.

According to alternative processing as set forth herein, prior to the formation of dielectric layer 142, an annealing of the epitaxial semiconductor film 138 at its profile boundary may be carried out by the use of hydrogen, deuterium, and the like. In any event, according to processing embodiments set forth herein, dielectric film 142 has a uniformity quality that is achieved by forming it upon epitaxial semiconductor film 138. The uniformity quality may be enhanced by annealing the epitaxial semiconductor film 138 as set forth herein. By reducing the density of dangling silicon bonds, the enhanced electrical field that is characteristic of dangling bonds is reduced.

In an access memory cell, a vertical transistor allows for a better sub-threshold (sub-L) characteristic, because a longer length transistor. Gate-induced leakage (GITL) in the inventive transistor is in a range from about 0.5 pico Amperes per transistor or less. According to the present invention, dielectric layer 142 achieves a uniformity that facilitates the low GITL. After the formation of dielectric layer 142, an electrical conductor 144 is patterned. Electrical conductor 144 may be applied to various structures such as in a dynamic random access memory cell in what may be used as a row select line, which may also be referred to as a word line. Electrical conductor 144 may be a doped polysilicon material such as that which has been used for polysilicon gate material for a MOSFET. Alternatively, electrical conductor 144 may be a metal material such as that which has been used for a metal gate material for a MOSFET.

FIGS. 13A and 13B illustrate further processing of the structure depicted in FIGS. 12A and 12B. A height reduction process has been carried out by which an electrode 146 has been formed in recess 120 that has an electrode upper surface 148 that is positioned below the upper surface 122 of substrate 118. Height reduction may be carried out by etching such as a dry etch that has an etch recipe selective to dielectric layer 142. FIG. 13B illustrates the continuity of electrode 146 as it spans STI structures 134 and 136.

In some process flows, dielectric layer 142, where it is positioned directly above upper surface 122 of substrate 118, may be significantly etched such that further insulation of upper surface 122 may be required. The achievement of electrode 146 with electrode upper surface 148 below the upper surface 122 of substrate 118 is a preferred structure because electrode 146 may be less affected by the corners 150, 152 that define recess 120. Similarly, the substantially curvilinear bottom profile 154 of epitaxial semiconductive film 138 acts to facilitate tunneling for improved operation of a MOSFET. The structure depicted in FIG. 13A also illustrates the presence of a source 156 active area and a drain 158 active area such that tunneling is initially and terminally vertical through the epitaxial semiconductor film 138.

Another embodiment is set forth in FIG. 13A. In order to achieve various functionalities of the vertical transistor, bottom doping 155 is carried out. The process flow of bottom doping starts with an alternatively deeper etch to form recess 12, and concludes with the formation of bottom doping 155 by ion implantation. Where source 156 and drain 158 are N+ doped, in one embodiment, bottom doping 155 is N++ according to known technique. In another embodiment, where source 156 and drain 158 are N+ doped, in one embodiment, bottom doping 155 is N+ according to known technique. In another embodiment, where source 156 and drain 158 are N+ doped, in one embodiment, bottom doping 155 is N according to known technique. In another embodiment, where source 156 and drain 158 are N+ doped, in one embodiment, bottom doping 155 is N− according to known technique. In yet another embodiment, where source 156 and drain 158 are N+ doped, in one embodiment, bottom doping 155 is N−− according to known technique. In another embodiment, where source 156 and drain 158 are N+ doped, in one embodiment, bottom doping 155 is selected from a range of P-doping according to known technique. Other embodiments include various N-dopings in source 156 and drain 158, and the N- and P-dopings for bottom doping 155 as set forth herein. Other embodiments include various P-dopings in source 156 and drain 158, and the N- and P-dopings for bottom doping 155 as set forth herein.

Another embodiment includes angled implantation 157 that is carried out to control the threshold voltage ($V_T$) of the vertical transistor. As set forth herein, angled implantation 157 follows various N- or P-doping process flows according to a given application for a given $V_T$.

It can be observed that, where first STI 134 is disposed above the plane of the structure depicted in FIG. 13A, source 156 and drain 158 are bounded in a first dimension (first STI 134) by a minimum photolithographic feature structure of length F. Similarly, where second STI 136 is disposed below the plane of the structure depicted in FIG. 13A, source 156 and drain 158 are bounded in a second dimension (second STI 136) by a minimum photolithographic feature structure of length F'. Typically, F and F' are substantially the same length.

A process example is set forth below. In this example, processing design rules are followed for a 0.25-micron process. Reference may be made to FIGS. 10A-13B. A substrate 118 is processed and filled with at least two STI structures 134, 136 to an initial height of about 2,500 Å and a width that is the minimum feature, F, of about 0.25 microns. Thereafter, the substrate 118 is patterned with a mask 126, and a dry anisotropic etch is carried out to a depth of about 1,000 Å to form a recess 120 in substrate 118. Some height reduction of the STI structures 134, 136 also occurs. Processing is carried out by locating substrate 118 in a purged or evacuated reaction chamber, metering a 100% $H_2$ gas to the chamber at ambient pressure, and heating the reaction chamber to about 1,000° C. for about 60 seconds. Flow of the $H_2$ gas is in a range from about 50 standard cubic centimeters per minute (sccm) to about 10 standard liters per minute (slm). According to the processing conditions, more than three monolithic crystallographic surfaces are exhibited in recess 120 by the formation of an epitaxial semiconductor film 138.

Next, annealing is carried out at about 1,000° C. and for about 60 seconds in a hydrogen-type atmosphere that is a 50:50 mixture of $H_2$ and $D_2$ to form a transition layer 116 that mends various dangling silicon bonds at the profile of the recess 120. Flow of the $H_2$ and $D_2$ gas is in a range from about 50 sccm to about 10 slm.

A dielectric layer 142 is next formed by chemical vapor deposition (CVD) of a silicon oxide material, to a thickness from about 50 Å to about 500 Å. Next, a P-doped polysilicon electrical conductor 144 is formed by CVD over substrate 118. Thereafter, an etchback is carried out that is selective to dielectric layer 142 to form an electrode 146. Finally, an interlayer dielectric (ILD) layer (not pictured) may be blanket deposited such as by CVD over substrate 118 that may also act to repair any incidentally etched portion of dielectric layer 142.

Figure 14:
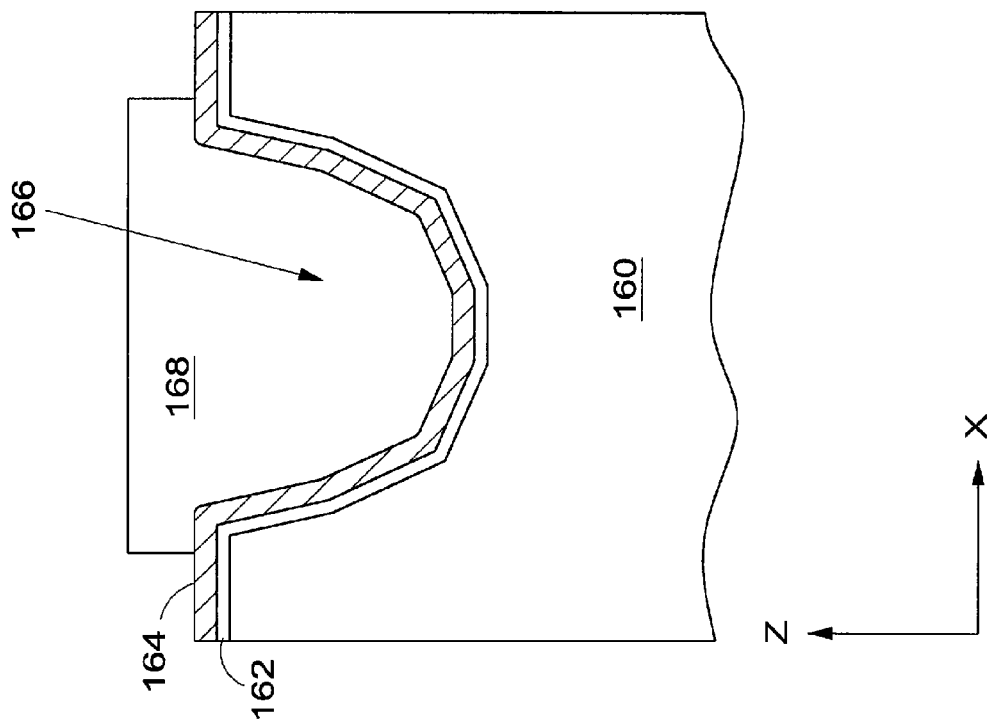
FIG. 14 is an elevational cross-section of a semiconductor structure according to a process flow application of one embodiment.

FIG. 14 is a cross-section that illustrates an application embodiment of a process flow embodiment. A substrate 160 has been patterned and a gate dielectric layer 162 and a doped polysilicon floating gate layer 164 have been formed over a recess 166. Because of the thinness of both gate dielectric layer 162 and a floating gate layer 164 a first center masking 168 of recess 166 has been accomplished in which photoresist material has been patterned to fill recess 166 and thus to protect gate dielectric layer 162 and floating gate layer 164 within recess 166.

Figure 15:
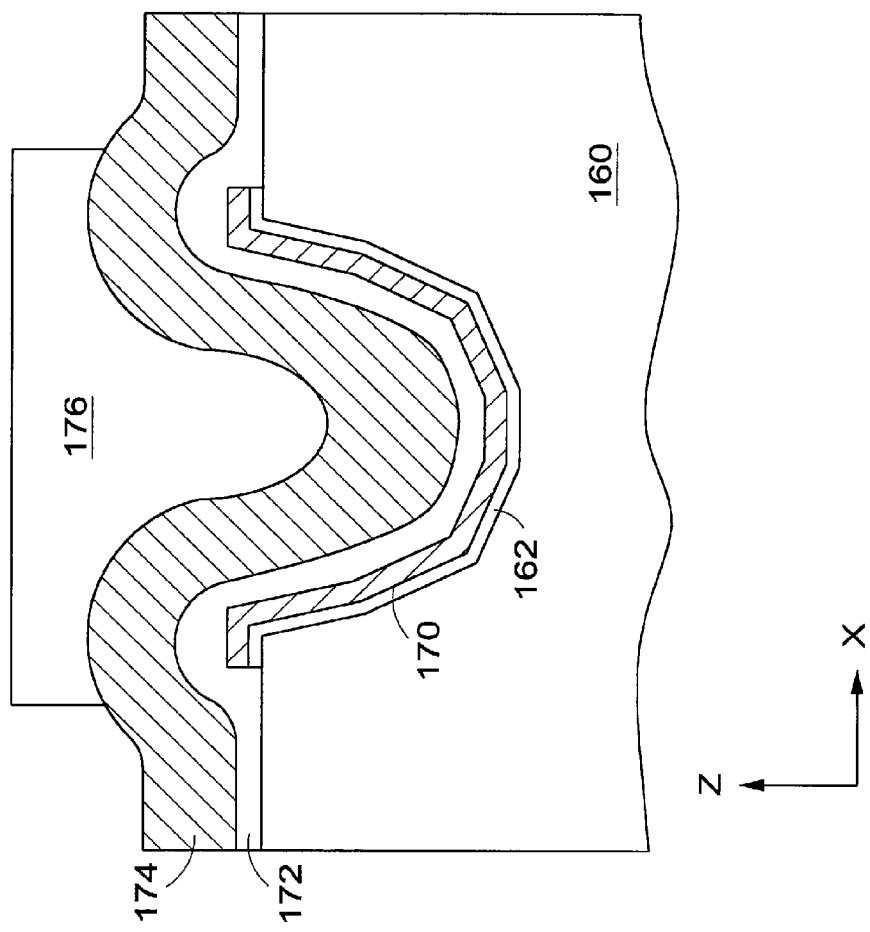
FIG. 15 is an elevational cross-section of the semiconductor structure depicted in FIG. 14 after further processing.

FIG. 15 illustrates further processing of the structure depicted in FIG. 14. A first patterning has accomplished to form a floating gate 170 from floating gate layer 164.

Incidently, gate dielectric layer 162 has also been patterned. A second dielectric layer 172 has been formed over floating gate 170, and an electrode layer 174 has been formed over second dielectric layer 172. Second dielectric layer 172 may be a layer that is formed by CVD as is known in the art, and as set forth herein. Additionally, further patterning is prepared for by the formation of a second center masking 176.

Figure 17:
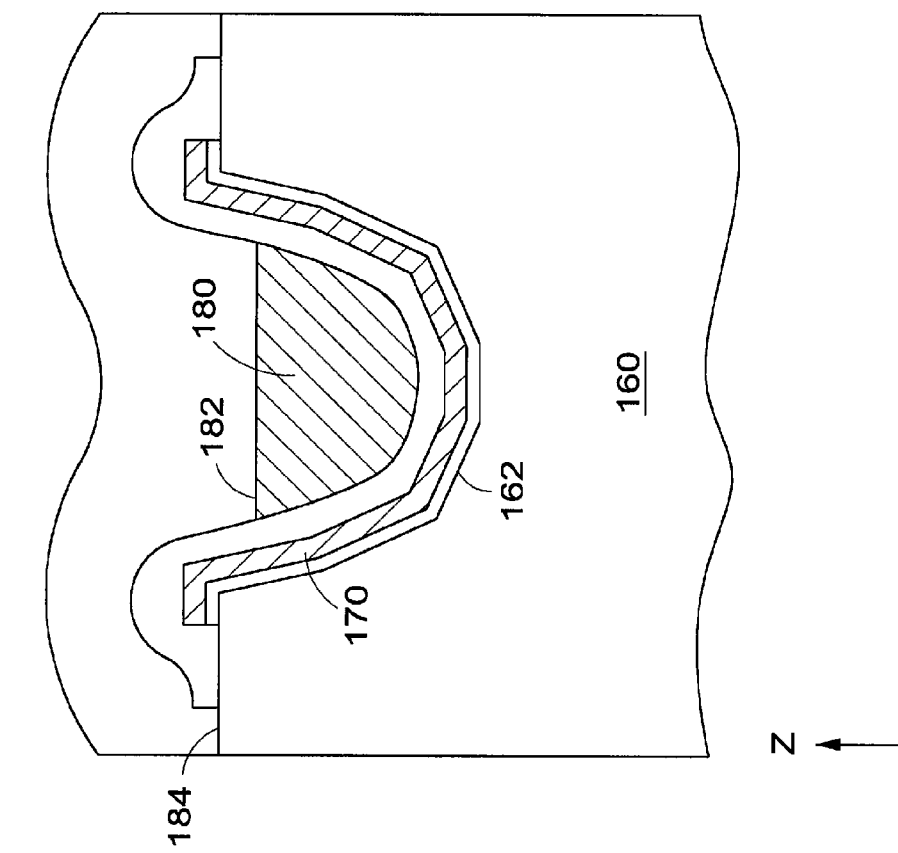
FIG. 17 is an elevational cross-section of the semiconductor structure depicted in FIG. 16 after further processing, by which a vertical floating gate has been achieved with a vertical transistor.
Figure 16:
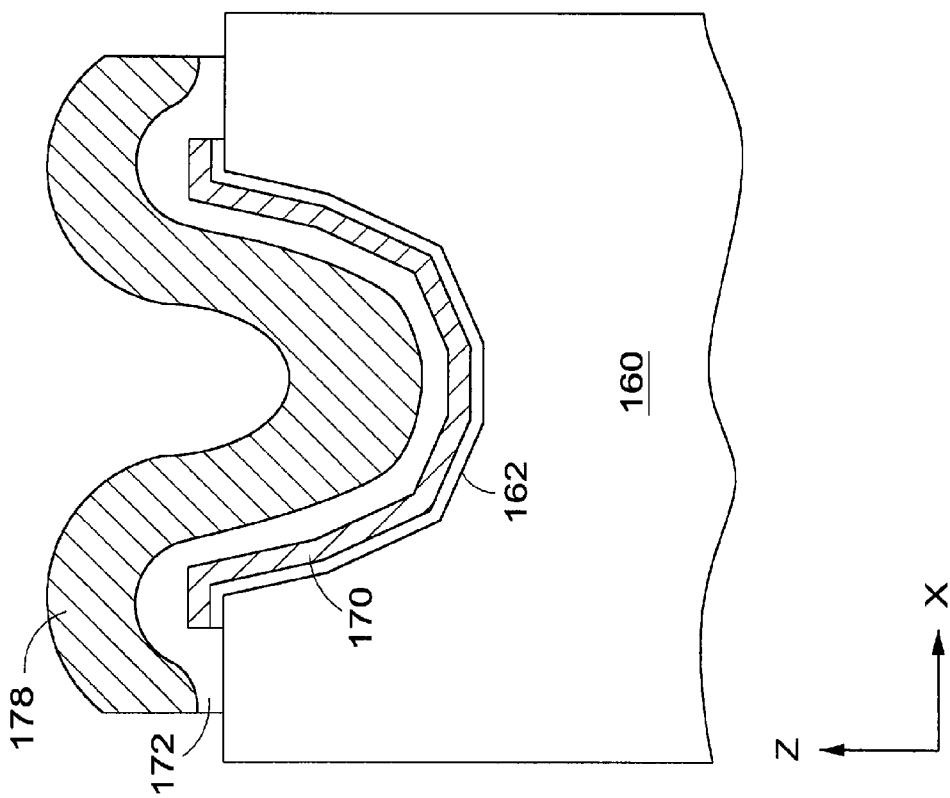
FIG. 16 is an elevational cross-section of the semiconductor structure depicted in FIG. 15 after further processing.

FIG. 16 is an elevational cross section of the structure depicted in FIG. 15 after further processing. After an etch process, the second center masking 176, depicted in FIG. 15, has allowed the formation of an electrode precursor 178, and second dielectric layer 172 has also been incidently patterned. FIG. 17 illustrates further processing of the structure depicted in FIG. 16. An etch has been accomplished to form an electrode 180 that has an upper surface 182 that is below the upper surface 184 of substrate 160. Accordingly, floating gate 170 is insulated from electrode 180, but is exposed to the benefits of a trench that has substantially curvilinear bottom as set forth herein. Accordingly, an electrical device comprising a vertical-floating-gate flash memory cell has been accomplished. It may now be apparent that similar processing techniques may be used for an alternative process flow that switches the positions of the floating gate 170 and the electrode 180.

Figure 18B:
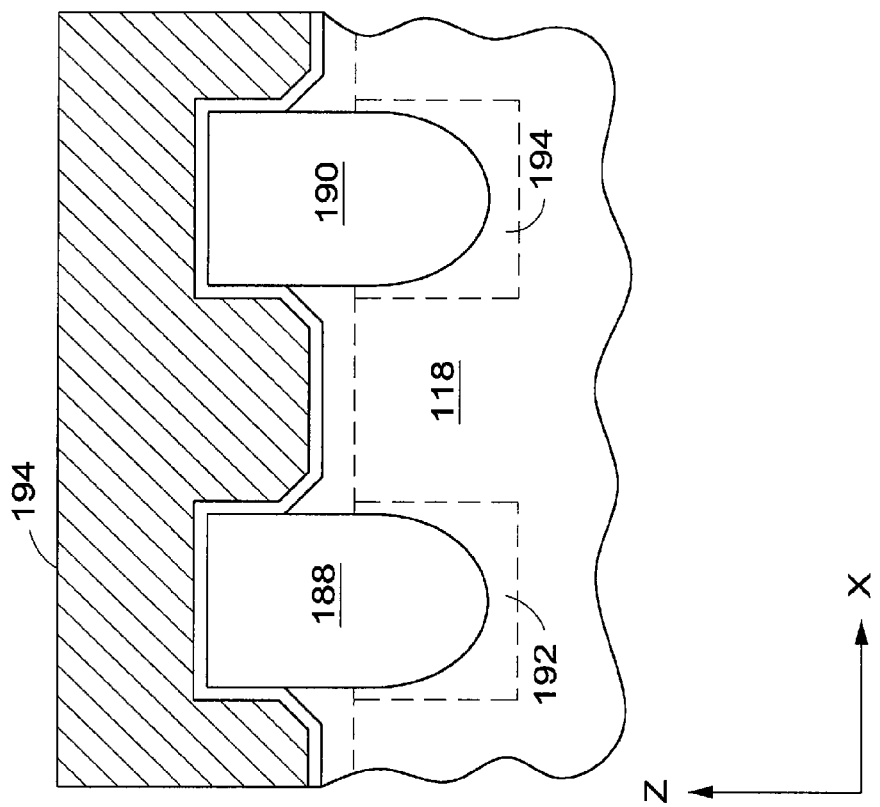
FIGS. 18A and 18B are elevational cross-sections of a semiconductor structure according to an embodiment.
Figure 18A:
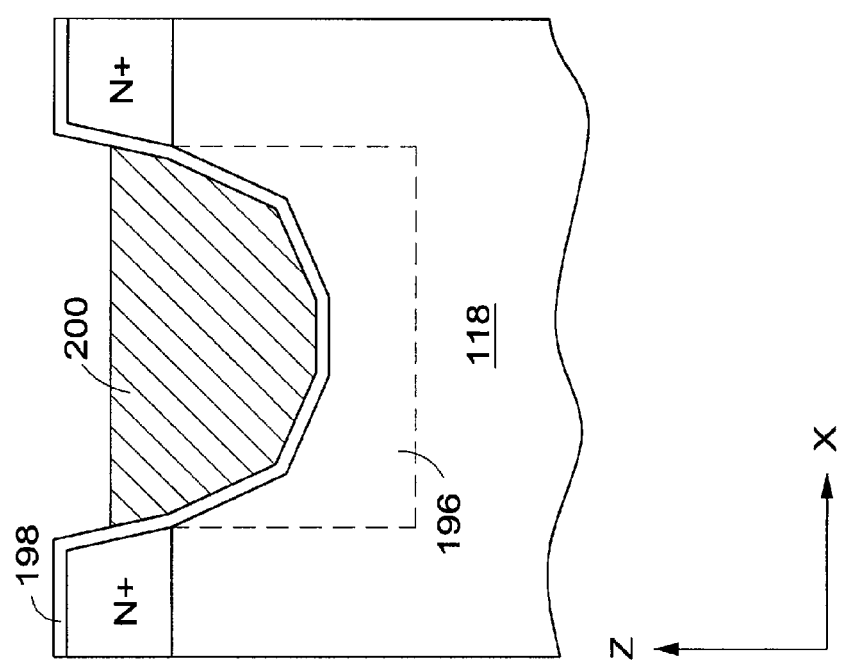

FIGS. 18A and 18B illustrate another embodiment of the structure depicted in FIGS. 13A and 13B. All processing that was done to accomplish the structures depicted in FIGS. 13A and 13B was carried out. However, the formation of substrate 118 has been patterned with both the STI structures 188 and 190 filling recesses that have been curvilinear-contoured with epitaxial semiconductor films 192 and 194. Other structures such as an epitaxial semiconductor film 196, a dielectric layer 198, and an electrode 200 may be substantially similar.

In another embodiment, preferred systems may be made that include the vertical transistor structure. For example, a chip package may contain a substrate such as one set forth in this disclosure. In another embodiment, the vertical transistor is part of an electrical device that includes the semiconductor substrate in a chip package and the chip package is part of a memory module or part of a chipset. In another embodiment, the memory module is part of a dynamic random access memory module that is inserted into a host such as a motherboard or a digital computer. In another embodiment, the vertical transistor is part of an electronic system. In another embodiment, the vertical transistor is fabricated with a floating gate. In another embodiment, the vertical transistor is fabricated with a floating gate that is part of a flash memory device that in turn may be part of a chipset such as a basic input-output system (BIOS) for an electrical device.

Figure 19:
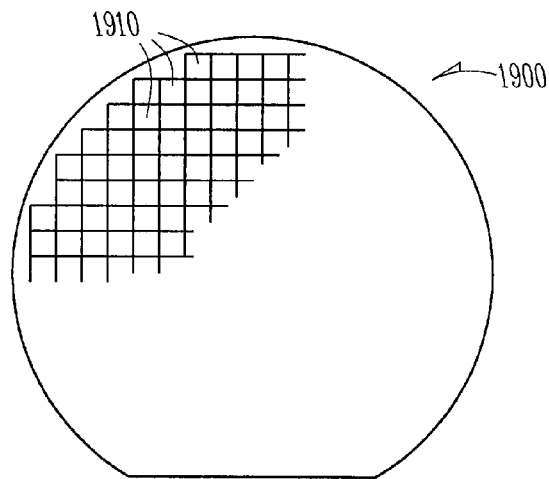
FIG. 19 is a top view of a wafer or substrate containing semiconductor dies in accordance with an embodiment of the present invention.

In another embodiment, preferred systems may be made that include the vertical transistor structure. With reference to FIG. 19, a semiconductor die 1910 may be produced from a silicon wafer 1900 that may contain the vertical transistor such as is depicted in FIGS. 13A, 13B, and FIGS. 18A and 18B. A die 1910 is an individual pattern, typically rectangular, on a substrate 118 that contains circuitry to perform a specific function. A semiconductor wafer 1900 will typically contain a repeated pattern of such dies 1910 containing the same functionality. Die 1910 may further contain additional circuitry to extend to such complex devices as a monolithic processor with multiple functionality. Die 1910 is typically packaged in a protective casing (not shown) with leads extending therefrom (not shown) providing access to the circuitry of the die 1910 for unilateral or bilateral communication and control. In one embodiment, die 1910 is incased in a host such as a chip package (not shown) such as a chip-scale package (CSP).

Figure 20:
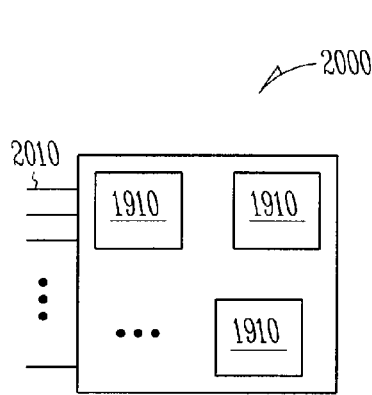
FIG. 20 is a block schematic diagram of a circuit module in accordance with an embodiment of the present invention.

As shown in FIG. 20, two or more dies 1910 at least one of which contains at least one vertical transistor such as is depicted in FIGS. 13A and 13B or FIGS. 18A and 18B, in accordance with the present invention may be combined, with or without protective casing, into a host such as a circuit module 2000 to enhance or extend the functionality of an individual die 1910. Circuit module 2000 may be a combination of dies 1910 representing a variety of functions, or a combination of dies 1910 containing the same functionality. Some examples of a circuit module 2000 include memory modules, device drivers, power modules, communication modems, processor modules and application-specific modules and may include multi-layer, multi-chip modules. Circuit module 2000 may be a sub-component of a variety of electronic systems, such as a clock, a television, a cell phone, a personal computer, an automobile, an industrial control system, an aircraft and others. Circuit module 2000 will have a variety of leads 2010 extending therefrom providing unilateral or bilateral communication and control. In another embodiment, circuit module 2000 has a vertical flash cell such as is depicted in FIG. 17. The vertical flash cell may be part of a flash memory module, a BIOS for an electrical device such as set forth herein, or the like.

Figure 21:
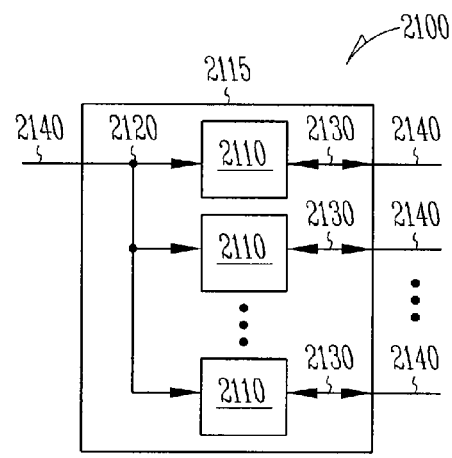
FIG. 21 is a block schematic diagram of a memory module in accordance with an embodiment of the present invention.

FIG. 21 shows one embodiment of a circuit module as memory module 2100 containing a structure for the inventive vertical transistor such as is depicted in FIGS. 13A, 13B, and FIGS. 18A and 18B, or the vertical flash cell as is depicted in FIG. 17. Memory module 2100 is a host for that generally depicts a Single In-line Memory Module (SIMM) or Dual In-line Memory Module (DIMM). A SIMM or DIMM may generally be a printed circuit board (PCB) or other support containing a series of memory devices. While a SIMM will have a single in-line set of contacts or leads, a DIMM will have a set of leads on each side of the support with each set representing separate I/O signals. Memory module 2100 contains multiple memory devices 2110 contained on support 2115, the number depending upon the desired bus width and the desire for parity. Memory module 2100 may contain memory devices 2110 on both sides of support 2115. Memory module 2100 accepts a command signal from an external controller (not shown) on a command link 2120 and provides for data input and data output on data links 2130. The command link 2120 and data links 2130 are connected to leads 2140 extending from the support 2115. Leads 2140 are shown for conceptual purposes and are not limited to the positions shown in FIG. 21.

Figure 22:
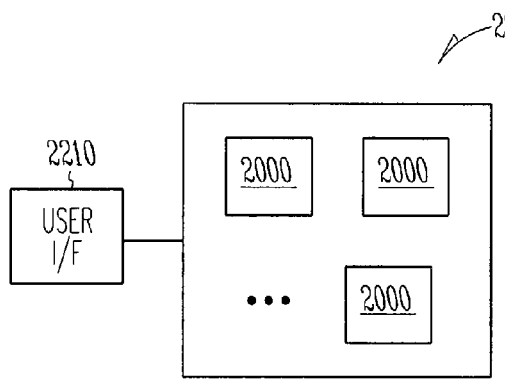
FIG. 22 is a block schematic diagram of an electronic system in accordance with another embodiment the present invention.

FIG. 22 shows another host type such as an electronic system 2200 containing one or more circuit modules 2000 as described above containing at least one of the inventive vertical transistor or vertical flash cell. Electronic system 2200 generally contains a user interface 2210. User interface 2210 provides a user of the electronic system 2200 with some form of control or observation of the results of the electronic system 2200. Some examples of user interface 2210 include the keyboard, pointing device, monitor and printer of a personal computer; the tuning dial, display and speakers of a radio; the ignition switch and gas pedal of an automobile; and the card reader, keypad, display and currency dispenser of an automated teller machine. User interface 2210 may further describe access ports provided to electronic system 2200. Access ports are used to connect an electronic system to the more tangible user interface components previously exemplified. One or more of the circuit modules 2000 may be a processor providing some form of manipulation, control or direction of inputs from or outputs to user interface 2210, or of other information either preprogrammed into, or otherwise provided to, electronic system 2200. As will be apparent from the lists of examples previously given, electronic system 2200 will often contain certain mechanical components (not shown) in addition to the circuit modules 2000 and user interface 2210. It will be appreciated that the one or more circuit modules 2000 in electronic system 2200 can be replaced by a single integrated circuit. Furthermore, electronic system 2200 may be a sub-component of a larger electronic system.

Figure 23:
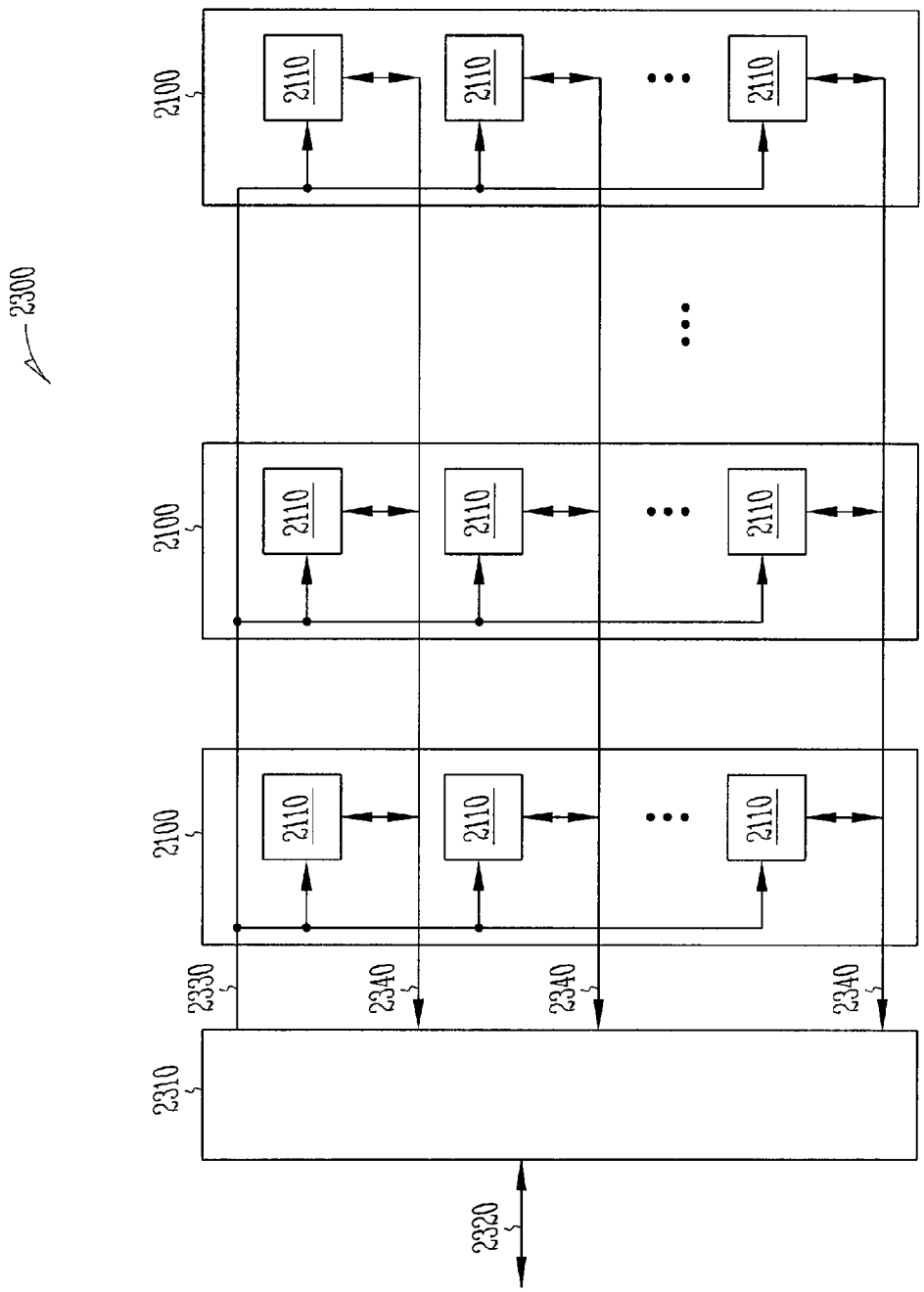
FIG. 23 is a block schematic diagram of a memory system in accordance with an embodiment of the present invention.

FIG. 23 shows one embodiment of an electrical device at a system level. The electronic system depicted in FIG. 23 is a memory system 2300. Memory system 2300 acts as a higher-level host that contains one or more memory modules 2100 as described above including at least one of the vertical transistor or the vertical flash cell such as set forth herein in accordance with the present invention and a memory controller 2310 that may also include circuitry for the inventive vertical transistor or the vertical flash cell. Memory controller 2310 provides and controls a bidirectional interface between memory system 2300 and an external system bus 2320. Memory system 2300 accepts a command signal from the external bus 2320 and relays it to the one or more memory modules 2100 on a command link 2330. Memory system 2300 provides for data input and data output between the one or more memory modules 2100 and external system bus 2320 on data links 2340.

Figure 24:
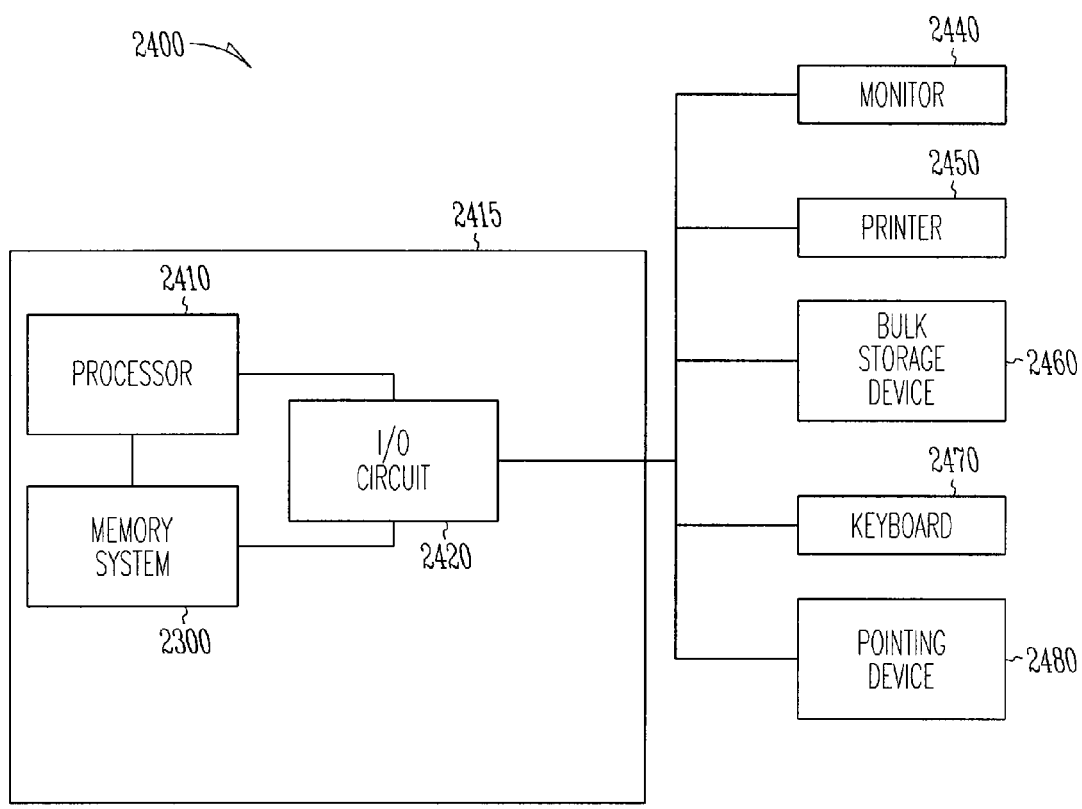
FIG. 24 is a block schematic diagram of a computer system in accordance with an embodiment of the present invention.

FIG. 24 shows a further embodiment of an electronic system as a computersystem 2400. Computer system 2400 contains a processor 2410 and a memory system 2300 housed in a computer unit 2415. Computer system 2400 is but one example of an electronic system containing another electronic system, i.e. memory system 2100, as a sub-component. The computer system 2400 may contain an input/output (I/O) circuit 2420 that is coupled to the processor 2410 and the memory system 2100. Computer system 2400 optionally contains user interface components that are coupled to the I/O circuit 2420. In accordance with the present invention a plurality vertical transistors or vertical flash cells may each be coupled to one of a plurality of I/O pads or pins 2430 of the I/O circuit 2420. The I/O circuit 2420 may then be coupled a monitor 2440, a printer 2450, a bulk storage device 2460, a keyboard 2470 and a pointing device 2480. It will be appreciated that other components are often associated with computer system 2400 such as modems, device driver cards, additional storage devices, etc. It will further be appreciated that the processor 2410, memory system 2100, I/O circuit 2420 and vertical transistors or vertical flash cells of computer system 240 can be incorporated on a single integrated circuit. Such single package processing units reduce the communication time between the processor 2410 and the memory system 2100.

CONCLUSION

A vertical MOSFET is accomplished in various embodiments, wherein a curvilinear trench bottom facilitates operation of the MOSFET.

The above-mentioned problems with integrated circuits and other problems are addressed by embodiments set forth herein and will be understood by reading and studying the written description. Structure, process, and system embodiments are set forth herein.

In one embodiment, a vertical transistor is provided that is disposed in a recess that has more than three monolithic crystallographic surfaces. In the recess, the more than three monolithic crystallographic surfaces may be referred to as a whole as a substantially curvilinear profile or a curvilinear, segmented-surface profile. Processing includes conditions that cause the substantially right-angle, three-surface recess profile to reshape with an epitaxial film that causes the recess profile to deviate from the substantially right-angle, three-surface recess profile, toward forming a multiple-crystallographic surface, curvilinear recess profile.

In another embodiment, processing conditions include the use of hydrogen that may cause silicon or other semiconductive material to mobilize and redeposit to form the characteristic curvilinear recess profile.

In another embodiment, processing includes an anneal that is used to repair or smooth dangling semiconductor bonds that form the characteristic curvilinear recess profile. This process flow adds to both preferred tunneling and a more uniform gate oxide layer.

In another embodiment, the process is carried out on a <100> monocrystalline silicon material and a metal oxide semiconductor field effect transistor is fabricated. The vertical transistor in each embodiment has the epitaxial semiconductor film. The epitaxial semiconductor film may have a minor thickness that is closer to the upper surface of the semiconductor substrate than to the former bottom of the recess, and a major thickness that is closer to the former bottom of the recess than the upper surface.

In another embodiment, an electrode is disposed in the recess, upon a gate oxide layer, and the electrode is processed to have an upper surface that is below the upper surface of the semiconductor substrate. This positioning of the electrode places it away from any sharp corners of the semiconductor substrate.

In another embodiment, the vertical transistor is fabricated between two shallow trench isolation structures, wherein the characteristic curvilinear profile of epitaxial semiconductor material forms on the semiconductive sidewalls, but polycrystalline material forms on the shallow trench isolation structures, if at all, to a lesser amount than the epitaxial semiconductor material.

In another embodiment, a minimum photolithographic feature comprises the width of the shallow trench isolation structure and the shallow trench isolation structure is disposed in a direction that is parallel with the gate from source to drain.

In another embodiment, the vertical transistor is part of an electrical device that includes the semiconductor substrate and a chip package. In another embodiment, the vertical transistor is part of an electrical device that includes the semiconductor substrate in a chip package and the chip package is part of a memory module. In another embodiment, the memory module is part of a dynamic random access memory module. In another embodiment, the vertical transistor is part of an electronic system. In another embodiment, the vertical transistor is fabricated with a floating gate. In another embodiment, the vertical transistor is fabricated with a floating gate that is part of a flash memory device.

These and other embodiments, aspects, advantages, and features of embodiments will be set forth in part in the description which follows, and in part will become apparent to those skilled in the art by reference to the following description of the embodiments and referenced drawings or by practice of embodiments.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An electric device, comprising:

a substrate;

a recess in the substrate, the recess being defined by a vertical sidewall and a bottom surface, the bottom surface comprising a horizontal first surface and an inclined, planar second surface intermediate the first surface and the sidewall, the bottom surface including a transition layer intermediate the substrate and a gate dielectric, the transition layer including silicon-deuterium;
a dielectric layer in the recess; and
a conductive layer over the dielectric layer.

2. The electric device of claim 1, wherein the transition layer includes silicon-hydrogen.

3. The electric device of claim 2, wherein the dielectric layer includes at least one of a refractory metal oxide, a silicon oxynitride and a silicon nitride.

4. The electric device of claim 1, wherein the first surface is flat, and wherein the second surface is flat.

5. The electric device of claim 4, wherein the first surface is at a bottom of the recess.

6. The electric device of claim 1, wherein the second surface includes a first edge adjacent the first surface and a second edge adjacent the sidewall, the second edge being above the first edge.

7. An electronic device, comprising:
a substrate including a recess defined by a plurality of non-horizontal, planar surfaces, wherein the non-horizontal surfaces are slanted from horizontal, the recess including no horizontal surfaces, the non-horizontal surfaces including a transition layer, the transition layer including at least one of deuterium and hydrogen;
a dielectric layer over the non-horizontal surfaces; and
a conductive layer over the dielectric layer.

8. The electronic device of claim 7, wherein the substrate includes silicon.

9. The electronic device of claim 7, wherein the substrate includes an N+ doped source adjacent the recess and an N+ doped drain adjacent the recess.

10. The electronic device of claim 7, wherein the plurality of surfaces are all non-parallel.

11. The electronic device of claim 7, wherein the plurality of surfaces are each non-vertical, wherein the non-vertical surfaces are slanted from vertical.

12. The electronic device of claim 7, wherein a first surface of the plurality of surfaces adjacent a bottom of the recess has an angle relative to horizontal less than a second surface of the plurality of surfaces, the second surface being closer to a top surface of the substrate.

13. An electronic device, comprising:
a substrate including a top surface;
a recess extending downwardly from the top surface, the recess being bound by a plurality of non-horizontal, planar surfaces, wherein the non-horizontal surfaces are slanted from horizontal, the recess including no horizontal surfaces, wherein a first surface of the plurality of surfaces adjacent a bottom of the recess has an angle relative to horizontal less than a second surface of the plurality of surfaces, the second surface being closer to a top surface of the substrate;
a dielectric layer in the recess and extending onto the top surface; and
a conductive layer extending into the recess and on the dielectric layer.

14. The electronic device of claim 13, wherein the conductive layer is a floating gate.

15. The electronic device of claim 14, wherein an intergate dielectric is on the floating gate, and wherein a control is on the intergate dielectric.

16. The electronic device of claim 15, wherein the substrate includes a first doped region adjacent the recess and a second doped region adjacent the recess.

17. The electronic device of claim 16, wherein the first region and second region are P doped.

18. An electronic device, comprising:
a substrate including a recess defined by a plurality of non-horizontal, planar surfaces, wherein the non-horizontal surfaces are slanted from horizontal, wherein the non-horizontal surfaces include a transition layer including at least one of deuterium and hydrogen;
a dielectric layer over the non-horizontal surfaces; and
a conductive layer over the dielectric layer.

19. The electronic device of claim 18, wherein the substrate includes silicon.

20. The electronic device of claim 18, wherein the substrate includes an N+ doped source adjacent the recess and an N+ doped drain adjacent the recess.

21. The electronic device of claim 18, wherein the plurality of surfaces are each non-vertical, wherein the non-vertical surfaces are slanted from vertical.

22. The electronic device of claim 18, wherein a first surface of the plurality surfaces adjacent a bottom of the recess has an angle relative to horizontal less than a second surface of the plurality surfaces, the second surface being closer to a top surface of the substrate.

23. An electronic device, comprising:
a substrate including a recess defined by a plurality of non-horizontal, planar surfaces, wherein the non-horizontal surfaces are slanted from horizontal, wherein the plurality of surfaces are all non-parallel, a first surface of the plurality of surfaces adjacent a bottom of the recess having an angle relative to horizontal less than a second surface of the plurality of surfaces, the second surface being closer to a top surface of the substrate;
a dielectric layer over the non-horizontal surfaces; and
a conductive layer over the dielectric layer.

24. The electronic device of claim 23, wherein the non-horizontal surfaces include a transition layer.

25. The electronic device of claim 23, wherein the substrate includes an N+ doped source adjacent the recess and an N+ doped drain adjacent the recess.

26. The electronic device of claim 23, wherein the plurality of surfaces are each non-vertical, wherein the non-vertical surfaces are slanted from vertical.

* * * * *